United States Patent
Kuwahara

(10) Patent No.: US 10,032,760 B2
(45) Date of Patent: Jul. 24, 2018

(54) SEMICONDUCTOR DEVICE

(71) Applicant: KABUSHIKI KAISHA TOSHIBA, Tokyo (JP)

(72) Inventor: Yoshimitsu Kuwahara, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,048

(22) Filed: Aug. 30, 2016

(65) Prior Publication Data

US 2017/0207211 A1     Jul. 20, 2017

(30) Foreign Application Priority Data

Jan. 19, 2016   (JP) ................... 2016-008331

(51) Int. Cl.
  *H01L 23/10*     (2006.01)
  *H01L 27/02*     (2006.01)
  (Continued)

(52) U.S. Cl.
  CPC ........ *H01L 27/0248* (2013.01); *H01L 23/373* (2013.01); *H01L 24/72* (2013.01); *H01L 27/0635* (2013.01); *H01L 29/7393* (2013.01)

(58) Field of Classification Search
  None
  See application file for complete search history.

(56) References Cited

U.S. PATENT DOCUMENTS 5,121,189 A * 6/1992 Niwayama ............ H01L 23/051
                                                        257/688
5,278,434 A * 1/1994 Niwayama ............ H01L 23/051
                                                        257/181
(Continued)

FOREIGN PATENT DOCUMENTS

JP   H07-37914   2/1995
JP   2741822     4/1998
(Continued)

OTHER PUBLICATIONS

Japanese Office Action dated Apr. 3, 2018, filed in Japanese counterpart Application No. 2016-008331, 8 pages (with translation).

*Primary Examiner* — Ali Naraghi
(74) *Attorney, Agent, or Firm* — Patterson & Sheridan, LLP

(57) ABSTRACT

A semiconductor device includes an annular-shaped first frame comprised of a ceramic and forming an inner cavity in which semiconductor elements are disposed. A first electrode is on one side and a second electrode is on another. A second frame in the inner cavity holds the semiconductor elements and is comprised of a resin. A first metallic member is on one side, has an annular shape, and connects the first frame and first electrode. A second metallic member is on the other side, has an annular shape, and connects the first frame and the second electrode. A first elastic body has a first portion between the first metallic member and the second frame and a second portion abutting an inner sidewall of the first frame or overlapping the first frame. A second elastic body has a first portion between the second metallic member and the second frame.

20 Claims, 7 Drawing Sheets

(51) Int. Cl.
   *H01L 23/373*   (2006.01)
   *H01L 27/06*   (2006.01)
   *H01L 29/739*   (2006.01)
   *H01L 23/00*   (2006.01)

(56) References Cited

U.S. PATENT DOCUMENTS

| | | |
|---|---|---|
| 5,371,386 A | 12/1994 | Tokunoh et al. |
| 6,295,205 B1 | 9/2001 | Lang et al. |
| 2001/0011757 A1* | 8/2001 | Miyake ................ H01L 23/051 257/415 |
| 2008/0073767 A1* | 3/2008 | Taguchi ................ H01L 23/051 257/683 |
| 2016/0111554 A1 | 4/2016 | Kuwahara et al. |
| 2016/0247736 A1* | 8/2016 | Kuwahara ............... H01L 23/62 |

FOREIGN PATENT DOCUMENTS

| | | |
|---|---|---|
| JP | H11345935 A | 12/1999 |
| JP | 2000091455 A | 3/2000 |
| JP | 2004-214524 | 7/2004 |
| JP | 2008084926 A | 4/2008 |
| JP | 2016-082105 | 5/2016 |

\* cited by examiner

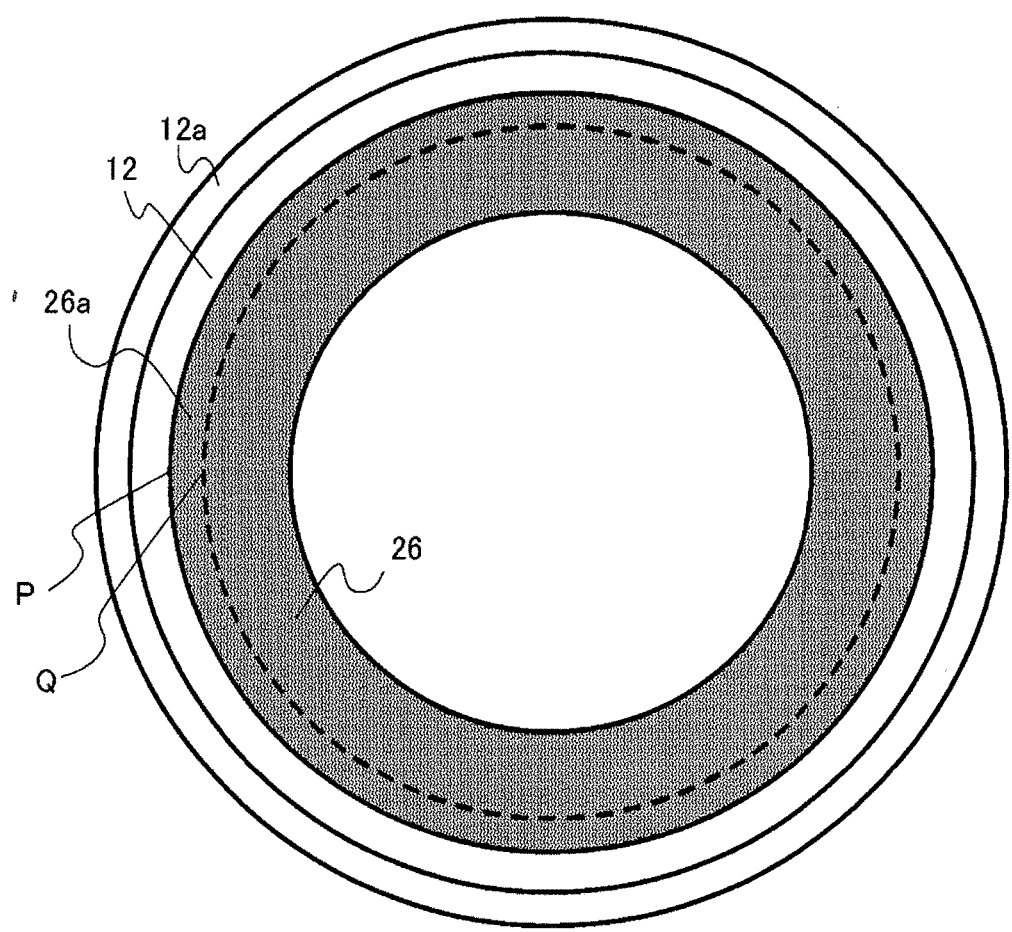

SEMICONDUCTOR DEVICE

CROSS-REFERENCE TO RELATED APPLICATION

This application is based upon and claims the benefit of priority from Japanese Patent Application No. 2016-008331, filed Jan. 19, 2016, the entire contents of which are incorporated herein by reference.

FIELD

Embodiments described herein relate generally to a semiconductor device.

BACKGROUND

A press pack semiconductor device allows improvements in power density due to heat release/dissipation from two surfaces and provides high reliability under high voltage and large current operating conditions. The press pack semiconductor device has a structure in which a plurality of semiconductor elements are provided inside an insulating frame and then sandwiched between upper and lower electrode blocks such that the inside of the insulating frame is sealed. Internal electric contact is maintained by a force applied to the upper and lower electrode blocks from the outside.

However, when one or more of the internal semiconductor elements of the press pack semiconductor device fails or is otherwise damaged, the press pack semiconductor device may be short-circuited even though other internal elements remain functional, and the overall press pack device may become inoperable. Therefore, in using press pack semiconductor devices these press pack devices are often connected in series with each other such that if one is short-circuited the larger system will not immediately fail.

However, when an excessive load is applied to the faulty and damaged semiconductor element and an overcurrent flows, there is a case where the semiconductor element is melted due to a remarkable increase in temperature due to the high voltages and large currents being passed through elements. As the semiconductor element is melted or even vaporized, there is a concern that internal pressure will increase and the semiconductor device may explode and damage other components or devices. When the semiconductor device explodes, pieces of the device may be scattered around, and critical circuits or a cooling device on the periphery of the semiconductor device may be damaged. Thus, the larger system becomes inoperable as well.

DESCRIPTION OF THE DRAWINGS

FIGS. 3A and 3B are schematic views of a semiconductor device of a comparative embodiment.

FIG. 5 is a schematic upper view illustrating a semiconductor device of a second embodiment.

DETAILED DESCRIPTION

Figure 1A:
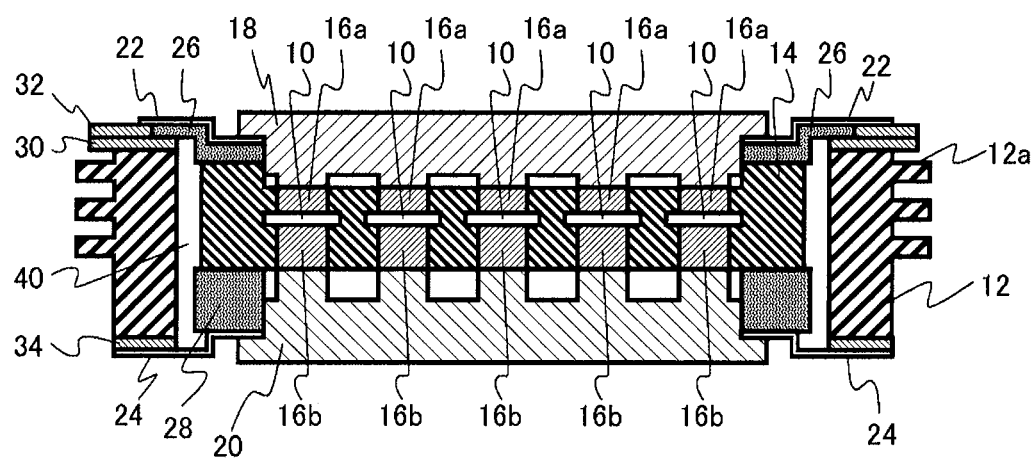
FIGS. 1A to 1C are schematic views illustrating a semiconductor device of a first embodiment.

In general, according to one embodiment, a semiconductor device includes a first frame comprising a ceramic material with an annular shape and that forms an inner cavity. A plurality of semiconductor elements is disposed within the inner cavity. A first electrode is on a first side of the plurality of semiconductor elements. A second electrode is on a second side of the plurality of semiconductor elements opposite the first side. A second frame is disposed inside the inner cavity. At least a part of the second frame is between the first electrode and the second electrode. The second frame comprises a resin material. The plurality of semiconductor elements are held by the second frame. A first metallic member is on the first side, has an annular shape, and connects the first frame and the first electrode. A second metallic member is on the second side, has an annular shape, and connects the first frame and the second electrode. A first elastic body has a first portion between the first metallic member and the second frame and a second portion abutting an inner sidewall of the first frame or overlapping the first frame in the first direction. A second elastic body has a first portion between the second metallic member and the second frame.

In the specification, "ceramic" means an inorganic material which can be formed into a solid body by a baking or sintering process. The inorganic material can be, for example, an oxide, nitride, or carbide material.

In the specification, a "displacement amount of a member until the member reaches an elastic limit" means an amount by which the member can be displaced or deformed by an external force without losing substantial elasticity. That is, the amount by which the component can be deformed by a force without transitioning from elastic to plastic deformation. In case of comparing "displacement amounts of two members until the members reach elastic limits", the amounts by which the respective members lose elasticity are compared by applying stress in the orientations which are the same for those of the two members.

Hereinafter, example embodiments of the present disclosure will be described with reference to the drawings. In addition, in the following description, same or similar members will be given the same reference numerals, and description on the members which have been described once may be appropriately omitted.

First Embodiment

Figure 1B:
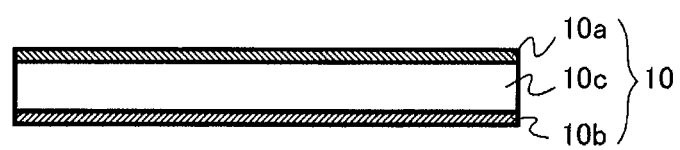
Figure 1C:
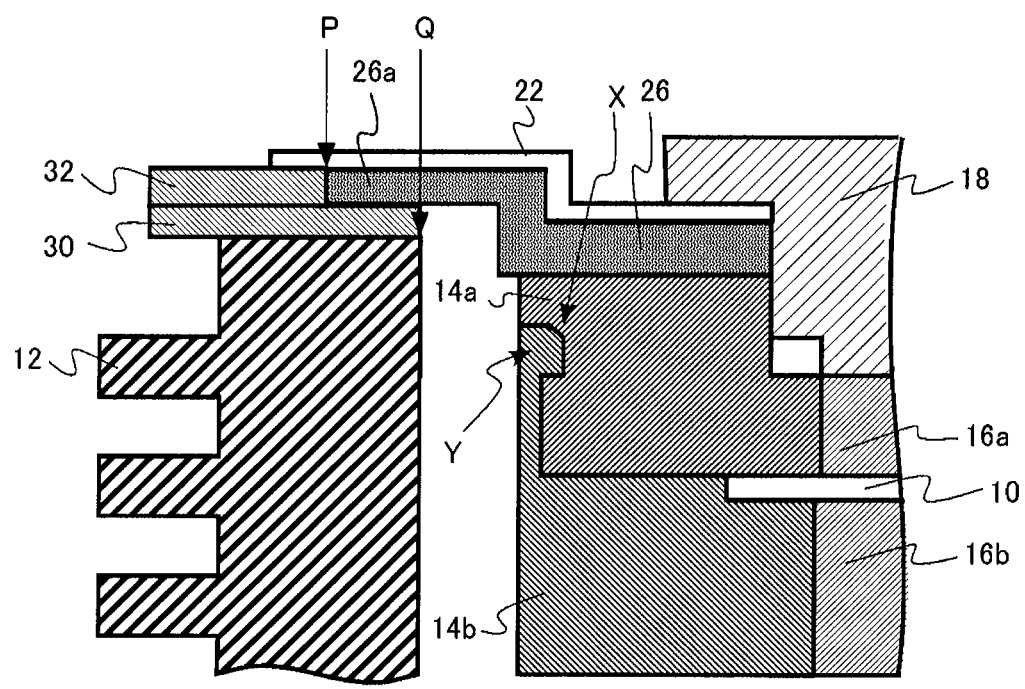

FIGS. 1A to 1C are schematic views of the semiconductor device of the first embodiment. FIG. 1A is a schematic sectional view of the semiconductor device. FIG. 1B is a schematic sectional view of a semiconductor element. FIG. 1C is a schematic sectional view in which a part of the semiconductor device is enlarged. The semiconductor device of the embodiment is a press pack semiconductor device. The semiconductor device of the embodiment is, for example, a press-pack IEGT (PPI).

The IEGT includes a plurality of semiconductor elements 10, a housing (first frame) 12, a resin frame (second frame) 14, a first thermal compensation plate 16a, a second thermal compensation plate 16b, a first electrode block (first electrode) 18, a second electrode block (second electrode) 20, a first flange (first member) 22, a second flange (second member) 24, a first protective member (first elastic body) 26, a second protective member (second elastic body) 28, a first metal plate 30, a second metal plate 32, a third metal plate 34, and a cavity portion 40.

The semiconductor device has the plurality of semiconductor elements 10 disposed therein. As illustrated in FIG. 1B, each semiconductor element 10 includes a first pad electrode 10a on a first surface, and a second pad electrode 10b on a second surface opposite to the first surface. A semiconductor chip region 10c is between the first pad electrode 10a and the second pad electrode 10b.

Each semiconductor element 10 is, for example, an injection enhanced gate transistor (IEGT) formed using a silicon (Si) substrate. The IEGT is an insulated gate bipolar transistor (IGBT) having an electronic injection promoting effect. The first pad electrode 10a is, for example, a collector electrode. The second pad electrode 10b is, for example, an emitter electrode. The semiconductor element 10 can also be provided with a gate pad which is not specifically illustrated in the drawings.

In addition, the type or structure of the semiconductor element 10 is not particularly limited as long as the device is provided with electrodes at upper and lower portions thereof, and for example, a diode, such as fast recovery diode (FRD) may also be employed. In addition, a metal oxide semiconductor field effect transistor (MOSFET) may be employed. In addition, for example, the IEGT and the FRD may be employed together. In addition, the semiconductor element 10 may be a reverse conducting-IEGT (RC-IEGT) in which the diode and the IEGT are integrated into one chip. Furthermore, the semiconductor element 10 is not limited to one formed using silicon, but may be a device formed using silicon carbide (SiC) or other semiconducting materials.

The semiconductor element 10 is disposed on the inner side of the housing (first frame) 12. The housing 12 is annular, and is formed of ceramic. The housing 12 has, for example, a cylindrical shape.

An inner diameter of the housing 12 is, for example, equal to or greater than 80 mm. A thickness of the housing 12 in the radial direction (wall thickness direction) is, for example, 4 mm to 20 mm.

The housing 12 is, for example, alumina. In place of alumina, for example, silicon nitride, zirconia, or aluminum nitride can be used.

The housing 12 is provided with, for example, a projection 12a for maintaining insulation properties (creeping distance) of the first electrode block 18 and the second electrode block 20.

The resin frame 14 is provided on the inner side of the housing 12. At least a part of the resin frame 14 is provided between the first electrode block 18 and the second electrode block 20. The resin frame 14 is formed of resin material.

The resin frame 14 holds the plurality of semiconductor elements 10. The resin frame 14 ensures an insulation distance between the semiconductor elements 10 is maintained, and also has a function of aligning the plurality of semiconductor elements 10.

The resin frame 14 includes a first sub-frame 14a and a second sub-frame 14b. The semiconductor element 10 is sandwiched between the first sub-frame 14a and the second sub-frame 14b.

A plurality of recessed portions X are provided in the first sub-frame 14a. In addition, a plurality of projected portions Y are provided in the second sub-frame 14b. By the projected portion Y being fitted to the recessed portion X, the first sub-frame 14a and the second sub-frame 14b are fixed and integrated with each other.

The first sub-frame 14a and the second sub-frame 14b are fixed by a fixing method relying on the elasticity of materials, which is a so-called "snap-fit" method. Alternatively, the plurality of recessed portions X may be provided in the second sub-frame 14b and the plurality of projected portions Y may be provided in the first sub-frame 14a.

The first thermal compensation plate 16a is provided on a first surface side of the semiconductor element 10. The second thermal compensation plate 16b is provided on a second surface side of the semiconductor element 10. In the first thermal compensation plate 16a and the second thermal compensation plate 16b, a material having a coefficient of thermal expansion which is close to that of the semiconductor element 10 is employed. For example, in a case where the semiconductor element 10 is predominately silicon, molybdenum has a coefficient of thermal expansion which is close to that of silicon and can be employed in thermal compensation plates 16a and 16b.

The first electrode block 18 is provided on the first surface side of the semiconductor element 10. In addition, the second electrode block 20 is provided on the second surface side of the semiconductor element 10. The first electrode block 18 and the second electrode block 20 have, for example, a cylindrical shape.

The first electrode block 18 is provided to be in contact with the first thermal compensation plate 16a, and the second electrode block 20 is provided to be in contact with the second thermal compensation plate 16b. The first electrode block 18 and the second electrode block 20 are formed of conductive metal, for example, copper.

The first flange 22 is provided around the first electrode block 18. The first flange 22 is annular. The first flange 22 is formed of metal, for example, copper or stainless steel.

The first flange 22 is used to connect the first electrode block 18 and the housing 12. The first electrode block 18 and the first flange 22 are connected to each other, for example, by silver alloy brazing.

The first flange 22 is connected to the housing 12 via the first metal plate 30 and the second metal plate 32. The first metal plate 30 and the second metal plate 32 are formed of, for example, a metal having a melting point which is higher than that of the first flange 22 and a high adhesiveness to the ceramic material of the housing 12. The first metal plate 30 and the second metal plate 32 are formed of, for example, an iron-nickel alloy. The first metal plate 30 and the second metal plate 32 are annular.

The second metal plate 32 and the first flange 22 are connected to each other, for example, by silver alloy brazing. The first metal plate 30 can be adhered to a metallized surface of the housing 12. The first metal plate 30 and the second metal plate 32 are joined to each other, for example, by welding with a laser.

The second flange 24 is provided around the second electrode block 20. The second flange 24 is annular. The second flange 24 is formed of metal, for example, copper or stainless steel.

The second flange 24 is used to connect the second electrode block 20 and the housing 12 to each other. The second electrode block 20 and the second flange 24 are connected to each other, for example, by silver alloy brazing.

The second flange 24 is connected to the housing 12 via the third metal plate 34. The third metal plate 34 is formed of, for example, metal having a melting point which is higher than that of the second flange 24 and a high adhesiveness to the ceramic material of the housing 12. The third metal plate 34 is formed of, for example, an iron-nickel alloy. The third metal plate 34 is annular.

The third metal plate 34 and the second flange 24 are connected to each other, for example, by silver alloy brazing. The third metal plate 34 adheres to the metallized surface of the housing 12.

The distance between the semiconductor element 10 and the first flange 22 is smaller than the distance between the semiconductor element 10 and the second flange 24.

The inside of the press pack device in which the semiconductor elements 10 are accommodated is air tightly sealed by the housing 12, the first electrode block 18, the second electrode block 20, the first flange 22, the second flange 24, the first metal plate 30, the second metal plate 32, and the third metal plate 34. The inside of the press pack device can be filled with inert gas, for example, nitrogen gas. By filling the inside with the inert gas, the semiconductor element 10, the first thermal compensation plate 16a, and the second thermal compensation plate 16b on the inside can be prevented from being oxidized.

The first flange 22 and the second flange 24 are, for example, plate-like metal components, and thus have spring-like properties which can be set to an appropriate strength. Therefore, when a pressurizing force is applied to the first electrode block 18 and the second electrode block 20 from the outside of the press pack device, the semiconductor element 10, the first thermal compensation plate 16a, the second thermal compensation plate 16b, the first electrode block 18, and the second electrode block 20 will tightly adhere to each other, and excellent electric contact is maintained. Accordingly, the first electrode block 18 is electrically connected to the first pad electrode 10a, and the second electrode block 20 is electrically connected to the second pad electrode 10b.

Figure 2:
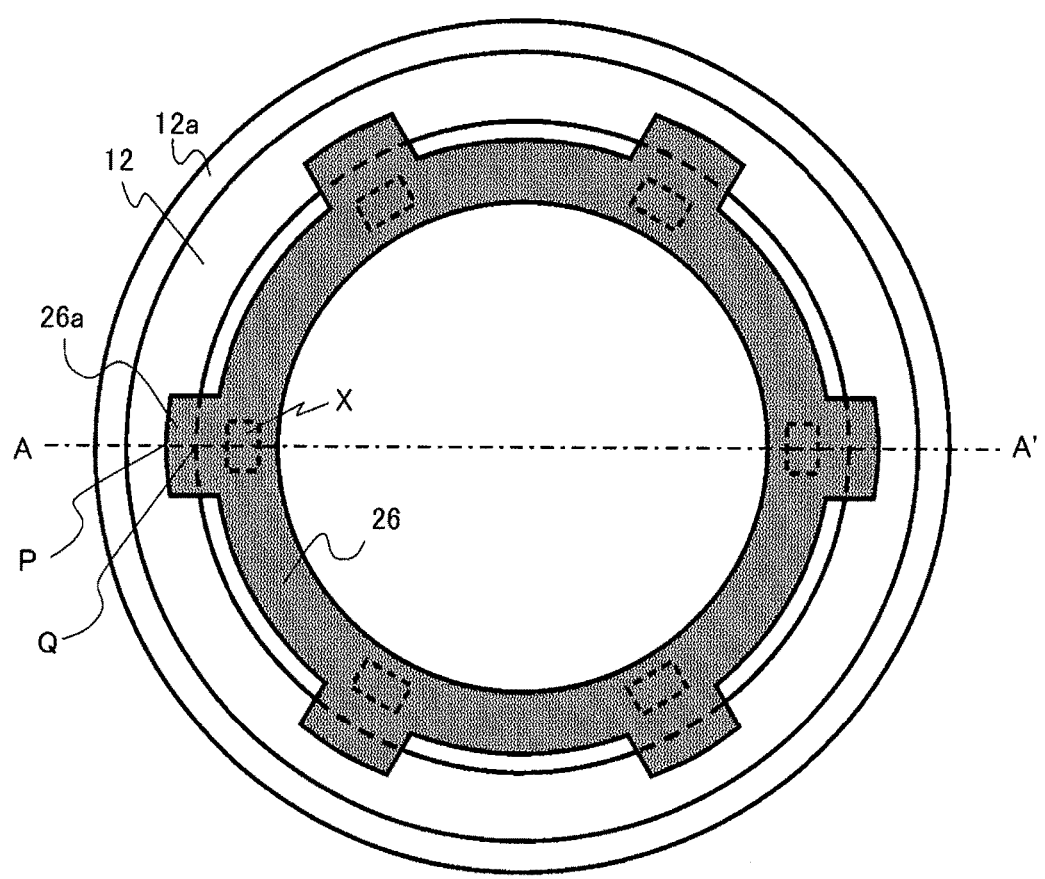
FIG. 2 is a schematic upper view of the semiconductor device of the first embodiment.

FIG. 2 is a schematic upper view of the semiconductor device of the embodiment. A shape as viewed from the upper surface of the first protective member 26 is illustrated, except for the first electrode block 18 or the like. In addition, FIG. 1A is a cross-section which corresponds to A-A' of FIG. 2.

The first protective member 26 is provided around the first electrode block 18. The first protective member 26 is annular. At least a part of the first protective member 26 is provided between the first flange 22 and the resin frame 14. The first protective member 26 is provided to be in contact with the first flange 22.

The first protective member 26 is provided with projected regions 26a at six locations of the outer circumferential portion. The projected regions 26a overlap the housing 12. In other words, end portions (P in FIGS. 1C and 2) of the projected region 26a are further on the outer circumferential side (outer side) of the housing 12 than an inner edge (Q in FIGS. 1C and 2) of the housing 12. The outer circumferential portion of the first protective member 26 other than the projected region 26a is further on the inner side than the inner edge of the housing 12. In addition, the number of projected regions 26a is not limited to six.

The displacement amount of the first protective member 26 until the first protective member 26 reaches the elastic limit is greater than that of the first flange 22. The first protective member 26 can be, for example, silicone, polytetrafluoroethylene (PTFE), or polyimide. Also, the first protective member 26 can be rubber, for example, silicone rubber.

The first protective member 26 has a function of protecting the first flange 22 or the housing 12 from piece of scattering members (shrapnel), for example, in a case where the components are melted as the semiconductor element 10 fails or is damaged, and an overcurrent flows and the internal temperature increases.

In the embodiment, the projected regions 26a are provided in the outer circumferential portion of the first protective member 26 to be sandwiched between the recessed portion X provided in the first sub-frame 14a and the first flange 22. In addition, the recessed portions X in the embodiment are provided at six locations of the first sub-frame 14a.

The second protective member 28 is provided around the second electrode block 20. The second protective member 28 is annular. At least a part of the second protective member 28 is provided between the second flange 24 and the resin frame 14. The second protective member 28 is provided to be in contact with the second flange 24.

In the first embodiment, the outer circumferential portion of the second protective member 28 is further to the inner side than the inner edge of the housing 12. In other words, the second protective member 28 is separated from the housing 12.

The displacement amount of the second protective member 28 until the second protective member 28 reaches the elastic limit is greater than that of the second flange 24. The second protective member 28 is, for example, silicone, PTFE, or polyimide. The second protective member 28 can also be rubber, for example, silicone rubber.

The second protective member 28 has a function of protecting the first flange 22 and the housing 12, in a manner similar to the first protective member 26.

Next, operations and effects of the semiconductor device of the embodiment will be described.

For example, when an excessive load is applied to a failed or damaged semiconductor element 10 and an overcurrent flows, there is a scenario where the semiconductor element 10 can be melted or even vaporized (at least in part) due to a remarkable increase in temperature. As the semiconductor element 10 is vaporized, the inner pressure of the press pack device may increase to such an extent that it explodes. When the press pack explodes, pieces of the device are scattered, circuits or cooling apparatuses on the periphery of the semiconductor device can damaged, and the overall system may thus become inoperable.

Figure 3A:
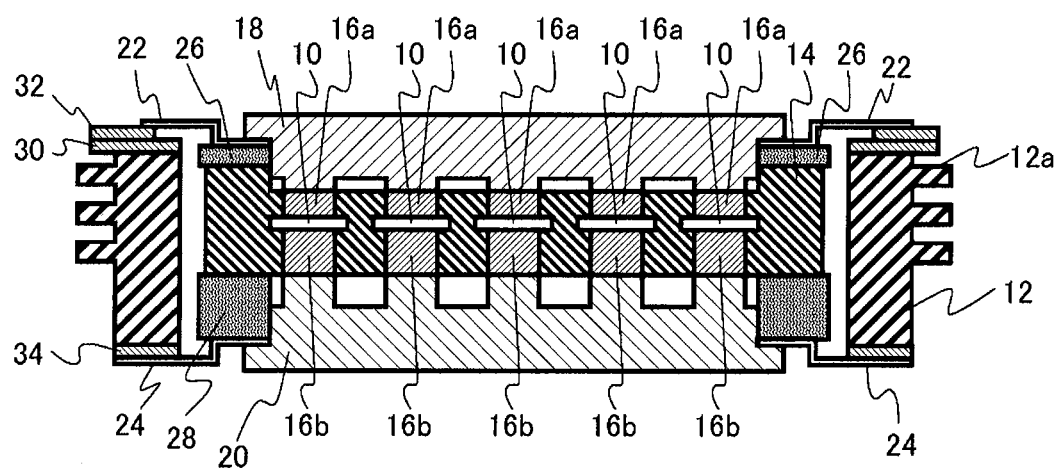
Figure 3A:
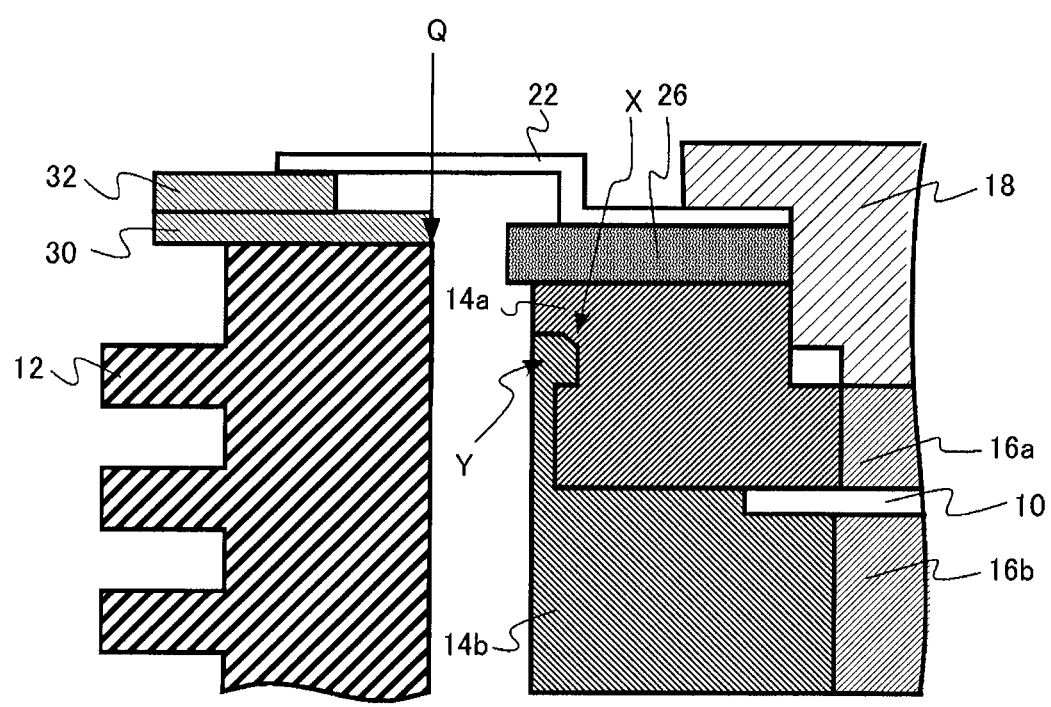

FIGS. 3A and 3B are schematic views of a semiconductor device of a comparative example. FIG. 3A is a schematic sectional view, and FIG. 3B is a schematic sectional view in which a part of the press pack device is enlarged. The device of the comparative example is a press pack semiconductor device similar in some ways to the semiconductor device of the embodiment. However, the device of the comparative example is different from the embodiment in that the first elastic body (26) is separated from the first frame (12).

As illustrated in FIGS. 3A and 3B, in the semiconductor device of the comparative example, the first protective member (first elastic body) 26 is further on the inner side of the housing 12 than the inner edge (Q in FIG. 3B) of the housing (first frame) 12.

Figure 4A:
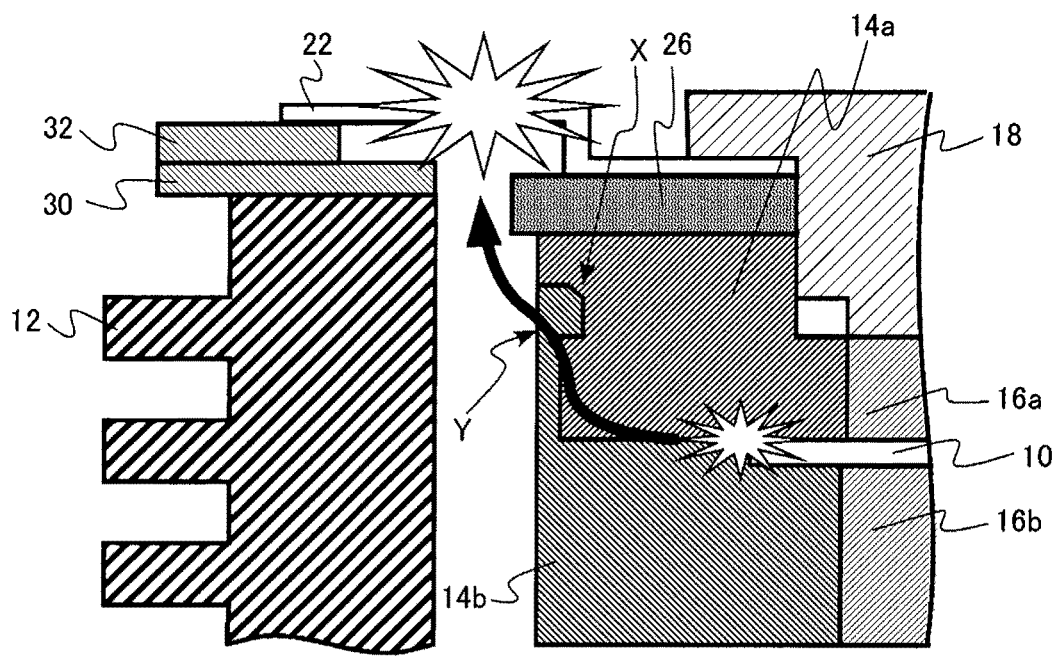
FIGS. 4A and 4B illustrate aspects of operations and effects of the semiconductor device of the first embodiment.
Figure 4B:
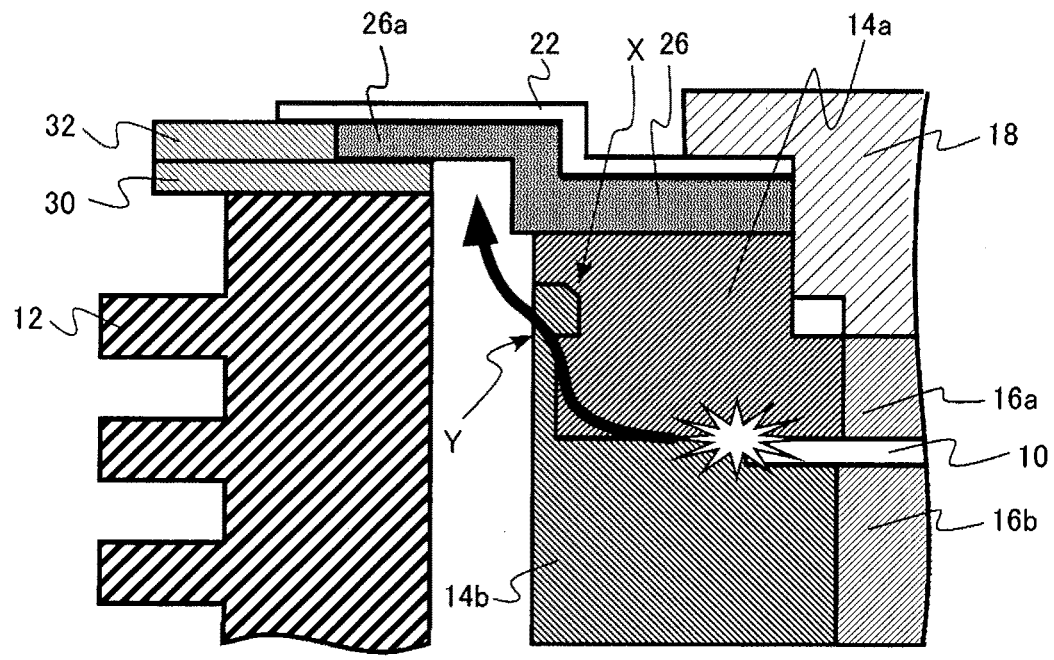

FIG. 4A is a view illustrating a case of the comparative example, and FIG. 4B is a view illustrating a case of the embodiment.

In a case where the semiconductor element 10 is melted and a part thereof is vaporized, the inner pressure of the semiconductor device increases. When the melted high-temperature silicon adheres to the first flange 22, the first flange 22 is melted by heat and the device is damaged. There is a concern that the contents of the press pack device will be blown out from the location at which the first flange 22 is melted, and be scattered around. As illustrated in FIG. 4A, in the comparative example, since the inner surface of the first flange 22 is exposed, the melted silicon directly adheres to the first flange 22.

However, as illustrated in FIG. 4B, in the first embodiment, by providing the projected region 26a, a portion of the inner surface of the first flange 22 is covered with the first protective member 26. Therefore, the melted silicon does not directly adhere to this portion of the first flange 22. Therefore, damage due to the melting of the first flange 22 is suppressed.

In a region in which the recessed portion X or the projected portion Y provided for fixing the first sub-frame 14a and the second sub-frame 14b is present, a mechanical strength of the resin frame 14 is weak compared to other regions of the sub-frame assembly. Therefore, silicon fragments are particularly likely to fly toward the first flange 22 by passing though the region where the recessed portion X or the projected portion Y are joined, and consequently the first flange 22 may be more likely to be melted or damaged as compared to the second flange 24.

In the first embodiment, by selectively providing the projected region 26a on the outer circumferential portion of the first protective member 26 that is sandwiched by the recessed portion X and the first flange 22, damage can be suppressed.

In addition, at the location at which the distance between the semiconductor element 10 and the first flange 22 is short, the first flange 22 is more likely to be melted. Therefore, by selectively providing the region 26a at locations at which the distance between the semiconductor element 10 and the first flange 22 is the shortest it is possible to suppress damage. That is, by positioning the regions 26a at the points at which the distance between a semiconductor element 10 and the first flange 22 is the shortest, damage can be suppressed.

In the embodiment, when a volume of the cavity portion 40 (which is present in the region surrounded by the housing 12, the first electrode block 18, the second electrode block 20, the first flange 22, and the second flange 24) is a first volume, and a volume occupied by the first protective member 26 and the second protective member 28 is a second volume, it is desirable that a ratio of the second volume to a sum of the first volume and the second volume is equal to or less than 5%.

Hereinafter, the ratio of the second volume to the sum of the first volume and the second volume will be referred to as a protective member occupancy ratio. Protective member occupancy ratio=(second volume)÷(first volume+second volume).

In addition, it should be noted that the volume of the above-described cavity portion 40 (first volume) corresponds to a volume that is obtained by excluding the volume occupied by the various components provided on the inside of the housing 12, such as the semiconductor element 10, the resin frame 14, the first thermal compensation plate 16a, the second thermal compensation plate 16b, the first protective member (first elastic body) 26, and the second protective member (second elastic body) 28, from the region surrounded by the housing 12, the first electrode block 18, the second electrode block 20, the first flange 22, and the second flange 24. That is, the second volume corresponds to the enclosed volume of the press pack device if the various internal components listed above were not actually present.

According to analysis, when the size of the first protective member 26 is increased in order to enhance the protection of the first flange 22, and the protective member occupancy ratio increases, it becomes apparent that the semiconductor device is more likely to be damaged as a crack is generated in the ceramic of the housing 12.

Table 1 illustrates a relationship between the protective member occupancy ratio and the presence or absence crack of the housing 12. The presence or absence of generation of cracking of the housing 12 is determined for cases in which a semiconductor element 10 was intentionally insulated and damaged, and thus made to fail.

TABLE 1

| | Protective member occupancy ratio | Presence or absence of cracking |
|---|---|---|
| Condition 1 | 50.7% | Present |
| Condition 2 | 50.5% | Present |
| Condition 3 | 46.8% | Present |
| Condition 4 | 44.6% | Absent |
| Condition 5 | 39.8% | Absent |
| Condition 6 | 38.0% | Absent |
| Condition 7 | 34.7% | Absent |

As can be ascertained from Table 1, by making the protective member occupancy ratio equal to or less than approximately 45%, it is possible to suppress generation of a crack in the housing 12. It is considered that the crack is more likely to be generated in a case where the protective member occupancy ratio is high because the inner pressure is likely to increase more during a failure event because the unoccupied volume of the cavity 40 is increasingly reduced by the presence of the protective member(s).

In the embodiment, by selectively providing the projected region 26a to the first protective member 26, the increase in the protective member occupancy ratio is somewhat suppressed. In addition, by providing a projected region (26a) only on the first flange 22 side of the device, the increase in the protective member occupancy ratio is also suppressed. Here, the distance of the semiconductor elements 10 from the first flange 22 side is somewhat less than the distance of the semiconductor elements to the second flange 24 side. Given the somewhat shorter distance between the semiconductor elements 10 and the first flange side, damage is somewhat more likely to occur at the first flange side.

According to the semiconductor device of the first embodiment, by providing the region 26a which protects the first flange 22, it is possible to suppress damage to the flange. In addition, by suppressing the increase in the protective member occupancy, it is possible to suppress damage to the housing 12.

Second Embodiment

The semiconductor device of the second embodiment is different from that of the first embodiment in that the entire region of the outer circumferential portion of the first elastic body (26) overlaps the first frame (12). The description of contents which overlap the first embodiment will be omitted.

FIG. 5 is a schematic upper view of the semiconductor device. A shape which is viewed from the upper surface of the first protective member 26 is illustrated.

As illustrated in FIG. 5, in the semiconductor device of the second embodiment, the region 26a of the entire outer circumferential portion of the first protective member (first elastic body) 26 overlaps the housing 12. In other words, all of the end portions (P of FIG. 5) of the region 26a are further to an outer circumferential side of the housing 12 than the inner edge (Q of FIG. 5) of the housing 12. That is, the first protective member 26 overlaps the inner edge of the housing and the region 26a is continuous along the inner circumference of the housing 12 rather than provided as discrete portions positioned only at certain points around the housing 12 circumference.

According to the semiconductor device of the second embodiment, the region 26a protects the first flange 22 in a manner similar to as was described for the first embodiment. Thus, it is possible to suppress damage to the flange.

Third Embodiment

The semiconductor device of the third embodiment is different from that of the first embodiment in that at least the outer circumferential portion of the first elastic body (26) directly abuts the inner sidewall of the first frame (12).

Figure 6A:
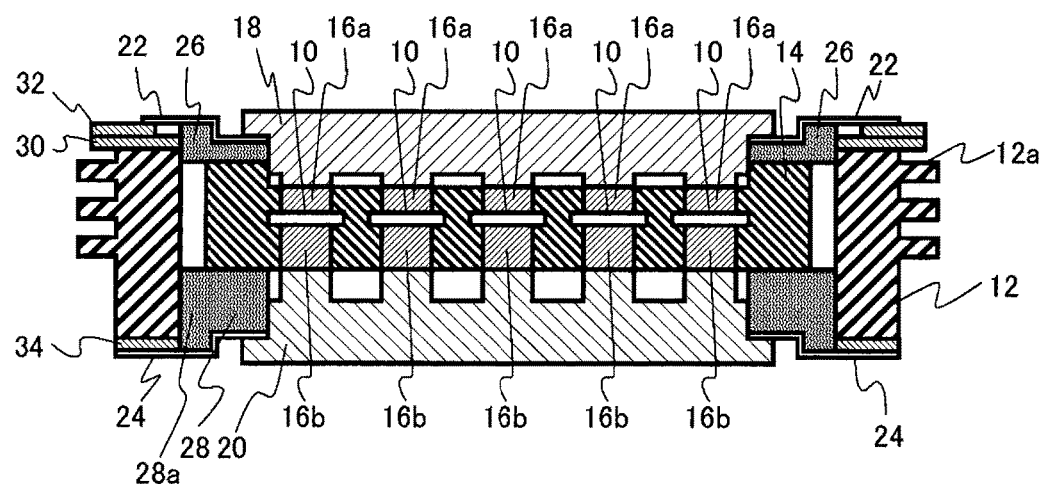
FIGS. 6A and 6B are schematic views illustrating a semiconductor device of a third embodiment.
Figure 6B:
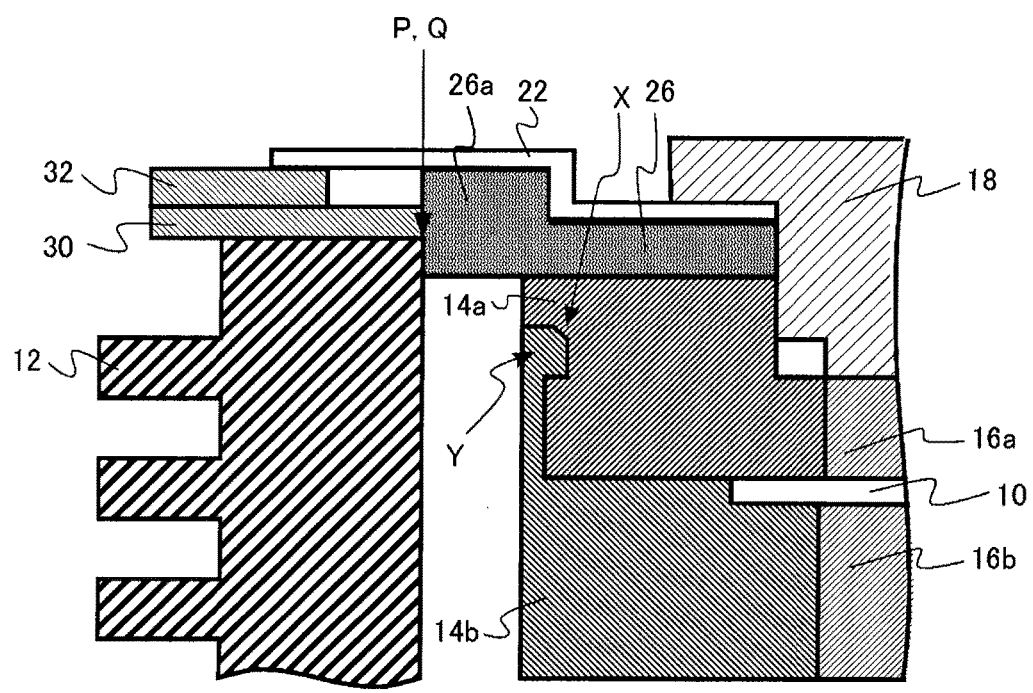

FIGS. 6A and 6B are schematic views of the semiconductor device of the embodiment. FIG. 6A is a schematic cross-sectional view and FIG. 6B is a schematic cross-sectional view in which a part of the relevant part of the semiconductor device has been enlarged.

The first protective member 26 is again provided with the projected regions (regions) 26a at six locations of the outer circumferential portion in a manner similar to the first embodiment. The projected regions 26a are in contact with the inner sidewall of the housing 12. In other words, the end portion (P in FIG. 6B) of the projected region 26a abuts the inner edge (Q in FIG. 6B) of the housing 12.

In addition, in the third embodiment, the second protective member 28 is also provided with projected regions (regions) 28a at six locations of the outer circumferential portion. The projected regions 28a are similarly in contact with the inner sidewall of housing 12 as the projected regions 26a. In other words, an end portion of the projected region 28a abuts the inner edge (sidewall) of the housing 12.

According to the semiconductor device of the third embodiment, the region 26a protects the first flange 22 in a manner similar to the first embodiment, and it is possible to suppress damage to the first flange 22. In addition, by providing the regions 28a to protect the second flange 22 it is possible to suppress damage to the second flange 22.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the example embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first frame comprising a ceramic material with an annular shape and forming an inner cavity;
   a plurality of semiconductor elements disposed within the inner cavity;
   a first electrode on a first side of the plurality of semiconductor elements;
   a second electrode on a second side of the plurality of semiconductor elements opposite the first side;
   a second frame disposed inside the inner cavity, at least a part of the second frame being between the first electrode and the second electrode, the second frame comprising a resin material, the plurality of semiconductor elements being held by the second frame;
   a first metallic member on the first side, having an annular shape, and connecting the first frame and the first electrode;
   a second metallic member on the second side, having an annular shape, and connecting the first frame and the second electrode;
   a first elastic body having a first portion between the first metallic member and the second frame and a second portion abutting an inner sidewall of the first frame or overlapping the first frame; and
   a second elastic body having a first portion between the second metallic member and the second frame.

2. The semiconductor device according to claim 1, wherein the second portion of the first elastic body comprises a plurality of discrete projections spaced from each other along an outer perimeter of the first portion of first elastic body.

3. The semiconductor device according to claim 2, wherein the second portion of the first elastic body overlaps the first frame.

4. The semiconductor device according to claim 2, wherein the second portion of the first elastic body abuts the inner sidewall of the first frame.

5. The semiconductor device according to claim 2, wherein:
   the second frame includes a first sub-frame and a second sub-frame and the plurality of semiconductor elements are sandwiched between the first sub-frame and the second sub-frame,
   the first sub-frame includes a plurality of recessed portions respectively mated to a plurality of projected portions in the second sub-frame at plurality of points along an outer perimeter of the second frame, and
   the plurality of discrete projections of the second portion of the first elastic body are positioned along the outer perimeter of the first portion of the first elastic body so as to correspond to the plurality of points along the outer perimeter of the second frame.

6. The semiconductor device according to claim 1, wherein the second portion of the first elastic body is a continuous ring disposed along an outer perimeter of the first portion.

7. The semiconductor device according to claim 1, wherein a ratio of a second volume to a sum of a first volume and the second volume is equal to or less than 45% when the first volume is set to be a volume that is enclosed by the first frame, the first electrode, the second electrode, the first metallic member, and the second metallic member in combination, and the second volume is set as a volume occupied by the first elastic body and the second elastic body in combination.

8. The semiconductor device according to claim 1, wherein the first elastic body comprises one of silicone, polytetrafluoroethylene, or polyimide.

9. The semiconductor device according to claim 1, wherein the first and second elastic bodies comprise a same material.

10. The semiconductor device according to claim 1, wherein the second portion of the first elastic body comprises six discrete projections spaced equally from each other along an outer perimeter of the first portion of the first elastic body.

11. The semiconductor device according to claim 1, wherein a bottom surface of the second portion of the first elastic body is offset from a bottom surface of the first portion of the first elastic body.

12. The semiconductor device according to claim 1, wherein a bottom surface of the second portion of the first elastic body and a bottom surface of the first portion of the first elastic body are at a same distance from the first electrode.

13. A semiconductor device, comprising:
a ceramic housing having an inner sidewall with an annular shape that forms an inner cavity region;
a semiconductor element disposed within the inner cavity region;
a first electrode on a first side of the semiconductor element and configured to make contact with the first side of the semiconductor element;
a second electrode on a second side of the semiconductor element opposite the first side and configured to make contact with the second side of the semiconductor element;
a resin frame disposed inside the inner cavity region and configured to hold the semiconductor element within the inner cavity region, at least a part of the resin frame being between the first electrode and the second electrode;
a first metallic flange connecting the ceramic housing and the first electrode; and
a first elastic body having a first portion between the first metallic flange and the resin frame and a second portion abutting the inner sidewall or overlapping the inner sidewall between the inner sidewall and the first metallic flange.

14. The semiconductor device according to claim 13, wherein the second portion of the first elastic body comprises a plurality of discrete projections spaced from each other along an outer perimeter of the first portion of first elastic body.

15. The semiconductor device according to claim 14, wherein the second portion of the first elastic body overlaps the inner sidewall.

16. The semiconductor device according to claim 14, wherein the second portion of the first elastic body abuts the inner sidewall.

17. The semiconductor device according to claim 13, wherein:
the resin frame comprises a first sub-frame and a second sub-frame which are mated to each other at a plurality of snap-fit portions disposed around an outer perimeter of the resin frame, and
the second portion of the first elastic body comprises a plurality of projecting portions disposed around an outer perimeter of the first portion to correspond in position to the plurality of snap-fit portions.

18. A semiconductor device, comprising:
a first frame being ring-shaped and surrounding a plurality of semiconductor elements within a first plane of an inner ring region;
a first electrode in contact with the plurality of semiconductor elements on a first side of the plurality of semiconductor elements;
a second electrode in contact with the plurality of semiconductor elements on a second side of the first plurality of semiconductor elements opposite the first side;
a second frame within the inner ring region, at least a part of the second frame being between the first electrode and the second electrode, the second frame comprising a resin material and configured to hold the plurality of semiconductor elements;
an annular first member surrounding the first electrode in a second plane parallel to the first plane, connecting the first frame and the first electrode, and comprising a metal;
an annular second member surrounding the second electrode in a third plane parallel to the first plane, connecting the first frame and the second electrode, and comprising a metal;
an annular first elastic body surrounding the first electrode in a fourth plane parallel to the first plane, a first portion of the annular first elastic body being between the annular first member and the second frame and a second portion directly contacting the first frame, the annular first elastic body being more elastic than the annular first member; and
an annular second elastic body surrounding the second electrode in a fifth plane parallel to the first plane, at least a part of the second elastic body being between the annular second member and the second frame, the annular second elastic body being more elastic than the annular first member.

19. The semiconductor device according to claim 18, wherein the second portion of the annular first elastic body comprises a plurality discrete projections that are spaced from each other along an outer perimeter of the first portion of the annular first elastic body.

20. The semiconductor device according to claim 19, wherein the plurality of discrete projections abut the first frame.

* * * * *